(12) United States Patent
Szymanski et al.

(10) Patent No.: US 7,246,054 B2
(45) Date of Patent: Jul. 17, 2007

(54) DISCRETE EVENT SIMULATION SYSTEM AND METHOD

(75) Inventors: Boleslaw K. Szymanski, Newtonville, NY (US); Gang Chen, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 595 days.

(21) Appl. No.: 10/436,890

(22) Filed: May 13, 2003

(65) Prior Publication Data
US 2004/0024578 A1    Feb. 5, 2004

Related U.S. Application Data

(60) Provisional application No. 60/379,859, filed on May 13, 2002.

(51) Int. Cl.
*G06F 17/50* (2006.01)
(52) U.S. Cl. .................. 703/17; 703/16; 703/19; 700/2; 719/314; 713/502
(58) Field of Classification Search .............. 703/17; 709/213, 218; 719/313; 700/2
See application file for complete search history.

(56) References Cited

U.S. PATENT DOCUMENTS

| 5,794,005 | A * | 8/1998 | Steinman | 703/17 |
| 5,801,938 | A * | 9/1998 | Kalantery | 700/2 |
| 6,341,262 | B1 * | 1/2002 | Damani et al. | 703/16 |
| 7,020,722 | B2 * | 3/2006 | Sivier et al. | 709/248 |
| 2002/0133325 | A1 * | 9/2002 | Hoare et al. | 703/17 |
| 2002/0143513 | A1 * | 10/2002 | Cohen et al. | 703/17 |
| 2004/0088392 | A1 * | 5/2004 | Barrett et al. | 709/223 |

OTHER PUBLICATIONS

G.Chen and B. K. Szymanski "Lookahead, Rollback and Lookback: Searching for Parallelism in Discrete Event Simulation", Jun. 11, 2000.*
R. Fujimoto, "Parallel Discrete Event Simulation", communication of the ACM, Oct. 1990.*
"Parallel Discrete Event Simulation". Richard M. Fujimoto. Communications of the ACM, Oct. 1990, vol. 33, No. 10, pp. 30-53.*
"Event Scheduling Schemes for Time Warp on Distributed Systems." E. Choi, and D. Min. Proceedings of the 1996 Winter Simulation Conference, pp. 661-668.*

(Continued)

*Primary Examiner*—Kamini Shah
*Assistant Examiner*—Kibrom Gebresilassie
(74) *Attorney, Agent, or Firm*—Wolf, Greenfield & Sacks, PC

(57) ABSTRACT

Lookback is defined as the ability of a logical process to change its past locally (without involving other logical processes). Logical processes with lookback are able to process out-of-timestamp order events, enabling new synchronization protocols for the parallel discrete event simulation. Two of such protocols, LB-GVT (LookBack-Global Virtual Time) and LB-EIT (LookBack-Earliest Input Time), are presented and their performances on the Closed Queuing Network (CQN) simulation are compared with each other. Lookback can be used to reduce the rollback frequency in optimistic simulations. The relation between lookahead and lookback is also discussed in detail. Finally, it is shown that lookback allows conservative simulations to circumvent the speedup limit imposed by the critical path.

14 Claims, 9 Drawing Sheets

OTHER PUBLICATIONS

"Maisie: A Language for the Design of Efficient Discrete-Event Simulation." R. L. Bagrodia, and W. Liao. 1994 IEEE. vol. 20. No. 4, pp. 225-238.*

Chen, G. et al.; "Lookback: A New Way Of Exploiting Parallelism In Discrete Event Simulation," Proceedings 16th Workshop on Parallel and Distributed Simulation, Washington, DC, May 12-15, 2002, IEEE Comput. Soc, pp. 153-162.

Palaniswamy, A.C. et al., "Parameterized Time Warp (PTW): An Integrated Adaptive Solution to Optimistic PDES," Jour. of Parallel and Distributed Computing, Sep. 15, 1996, pp. 134-145.

Avril, H. et al., "Clustered Time Warp And Logic Simulation," Proceedings of 9th Workshop On Parallel and Distributed Simulation, Lake Placed, NY, Jun. 14-16, 1995, IEEE Comput.Soc., pp. 112-119.

* cited by examiner

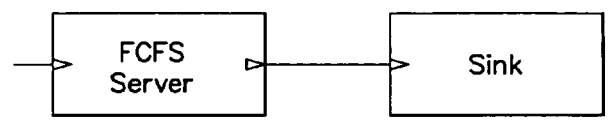
FIG. 6A
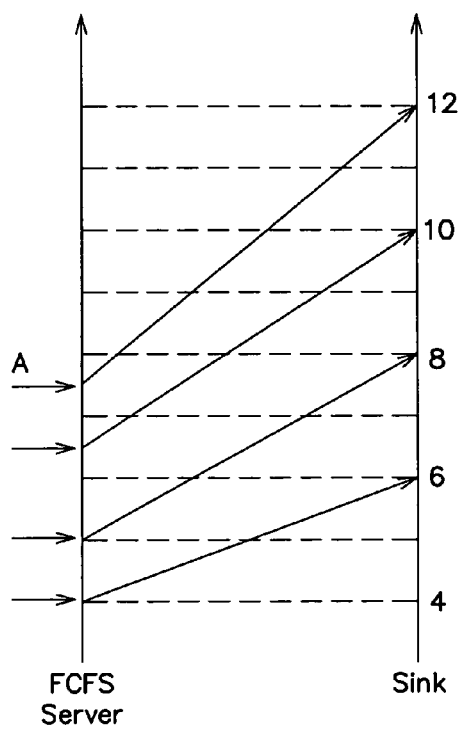 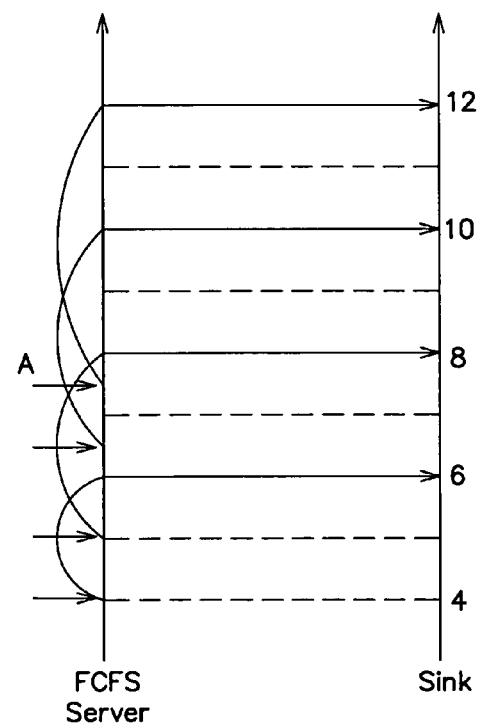
FIG. 6B      FIG 6C

(a) Independent Events A and B (b) Independent Events B and C

DISCRETE EVENT SIMULATION SYSTEM AND METHOD

RELATED APPLICATIONS

This application claims priority under 35 U.S.C. § 119(e) to U.S. Provisional Application Ser. No. 60/379,859 (Now Expired), entitled "METHOD FOR SYNCHRONIZING PARALLEL EVENT SIMULATION BASED ON LOOK-BACK PROPERTY," by B. Szymanski and G. Chen, filed on May 13, 2002, the contents of which is incorporated herein by reference in its entirety.

FEDERALLY SPONSORED RESEARCH

This invention was made with Government support under National Science Foundation (NSF) Grant KDI-9873139. The Government may have certain rights to this invention.

FIELD OF INVENTION

The invention relates generally to simulation systems, and more particularly to simulation systems that model discrete events and their related systems.

BACKGROUND OF THE INVENTION

Simulation is used to understand the behavior of systems. Typically, simulation is beneficial for use in understanding the behavior of complex systems in an environment without having to test an actual working system. For instance, in computer networks, it may be beneficial to model the network system as a group of attached nodes, each of which forwards data to other nodes and communicates routing information between the nodes. Simulation is useful to simulate a large network (e.g., the Internet) as it is not realistic to assemble and test such a network of such a large scale. A network-specific simulation system such as BONeS (available from Cadence, Inc., San Jose, Calif.) and OPNET (available from OPNET Technologies, Inc., Bethesda, Md.) are used to model such a network system. Other simulation systems are available.

Other simulation systems are used to solve different problems. For example, there are simulation systems that have been developed to solve particular problems (e.g., analog\digital circuit design). For instance, it may be useful to model and simulate components of an integrated circuit, system-on-a-chip, or other processing system. In these cases, it may be useful to understand the workings of the chip in a simulation before it is produced. By simulating the chip and identifying issues before production, design issues that may affect the quality of the chip (e.g., performance) may be avoided prior to production. Further, supporting systems (e.g., other chips, systems, etc.) with which the chip may interact may also be simulated. There are other simulation systems that may be used to solve particular problems (e.g., Flexsim (available from FlexSim Software Products, Inc.)—to simulate business processes, SPADES (available from SourceForge.net) to simulate parallel-executing software agents, etc.). Also, there are a number of general-purpose simulation systems and languages (e.g., CSMP, CSSL, SIMULA, etc.) that can be programmed to simulate different types of systems having a variety of properties.

However, simulation is a very time-consuming process, both in the programming necessary to develop the simulation and the resources (time, processing capability of the simulation system) needed to execute it. Generally, a simulation is executed on one or more computer systems having one or more processors (e.g., a personal computer, workstation, mainframe, etc.). These systems are limited in their capability for processing multiple parallel events, and as the number of entities being modeled increases, the amount of memory required for the simulation and number of processing cycles also increases. When simulating large systems (e.g., a network having thousands of nodes), limitations of the simulation system become more apparent. Thus, there is a need for increasing the performance of simulation systems, and in particular, for increasing performance in a simulation system to handle a higher number of parallel events.

There are different types of simulations that can be performed based on the system being simulated. Continuous time simulation systems are used to simulate time-dependent systems (e.g., a server that responds to one or more clients) that have some type of time relationship. Other simulation systems may model events not dependent on time, and this type of simulation is referred to as discrete event simulation. A simulation system may implement one or both of these simulation techniques.

The system being modeled may be aware of time, and may respond to events and may schedule events in time. Other entities may not be aware of time (e.g., a FIFO, a calculator), and are generally responsive to entities in the simulation environment that may or may not be time-aware. There are also time-independent entities that maintain their own time themselves, and may interact with other entities that maintain their own simulation times. Generally, modeling and simulation of time-independent systems is more complex than time-dependent systems, as more processing is involved in maintaining independent system time for each entity and for simulating the parallel processing of events at each entity. Processing of time-independent systems is referred to in the art as Parallel Discrete Event Simulation or PDES.

There are problems with simulating systems that implement parallel discrete events. Some simulators execute events serially, but generally this is inefficient as the number of parallel-operating entities increases. Multiple computers/processors/logical processes (hereinafter, a processing "entity") may be used to perform parallel simulations to increase performance, but coordination between the parallel processing entities becomes problematic. In particular, it becomes difficult to execute events concurrently on different processing entities without knowing the exact causal relationship between the parallel executions of those entities. More simply stated, a processing of a first event on one processing entity may affect the execution of a second event on another processing entity. An execution of one event (e.g., the first event) in a wrong order with respect to the other event (e.g., the second event) may cause a simulation error to occur.

Several different methods (protocols) for coordinating the simulation of parallel entities on different processors exist. For example, there is a general class of protocols referred in the art as lookahead protocols that try to predict the future within the simulation. That is, lookahead protocols attempt to predict the receipt of future events that will be received by exchanging messages between processing entities that identify the lowest timestamp of an event that can be sent, and therefore communicating the status of other processing entities. Generally, the processing entities each wait to process additional event until they determine with certainty that events do not affect each other. These protocols are generally conservative, as the individual processing entities have a tendency to wait for one another to process events. This characteristic makes the simulation proceed non-optimally.

Another class of parallel event simulation protocols includes what are referred to in the art as "optimistic" protocols that assume that the processing of events by one processing entity does not affect processing at other processing entities. Because causal entities do affect each other and this assumption is not true in general, such protocols must maintain the ability to correct the past when an event is processed that affects another processing entity (a causal event). In this case, the simulation is "rolled back" to correct the processing of the causal event, and to advance the simulation from that rolled-back point in simulation time. This is accomplished at each processing entity by maintaining every event processed locally to the processing entity so that the processing entity may recover from an out-of-order execution. Generally this is done by saving changes in state of data in a change list or other structure used to track changes. As can be appreciated, this rolling-back of simulation time is inefficient, and as the number of entities being simulated increases, each having one or more causal relationships with each other, the number of rollbacks also increases. Rollbacks are computationally expensive, as many processing cycles are wasted due to the number of lost processing cycles. Also, the amount of memory required by the simulation system(s) to store changes corresponding to each processed event becomes prohibitive, especially when there are a large number of modeled entities. What is needed, therefore is a more efficient protocol for simulating the execution of parallel events.

Researchers have long realized that Parallel Discrete Event Simulation (PDES) is an effective approach to simulating large-scale complex systems. Research on PDES has been going on for more than twenty years. The main difficulty in this area is to achieve high efficiency of parallel execution while preserving the causality order between events for the simulation carried out on multiple processors. The logical process paradigm, widely used in the PDES community, assures that no causality errors will occur if each logical process adheres to the local causality constraint, i.e., if each logical process executes its events in non-decreasing timestamp order. Therefore, to preserve the causality order, it is sufficient, but not necessary, that each logical process finds and executes the future event with the smallest timestamp.

The advent of PDES was marked by the invention of conservative protocols, the first of which was the null message protocol, or so-called Chandy/Misra/Brynt protocol, developed in 1979. In most cases, conservative protocols require each logical process to broadcast to its neighbors, in the form of null messages, a low bound on the timestamp of events it will send to other logical processes, or Earliest Output Time (EOT). By listening to the null messages from all neighbors, each processing entity can determine the lowest timestamp it will receive in a message in the future, or Earliest Input Time (EIT). If this timestamp is greater than that of the earliest event in its local event list, the process is sure that this earliest event can be processed without violating the causality constraint. Otherwise, the processing entity has to block until this condition is met (i.e., the message in transit carrying the event with the smallest timestamp is received and this event is placed on the local event list).

In 1985, Jefferson published a paper describing a construct referred to as Virtual Time, which proposed a new synchronization paradigm called Time Warp. In the Time Warp and other optimistic protocols, a logical process is allowed to aggressively process events in its local event list, and during the event execution new messages can be sent to other logical processes. However, when an event arrives from another logical process with a timestamp smaller than the local simulation time, it triggers a causality error. As a result, all processed events having a larger timestamp must be rolled back, and anti-messages must be sent to other logical processes to counteract those messages sent during the erroneous computation. Ironically, although they are called optimistic, these protocols are actually quite pessimistic, in the sense that they must save every change made to the state in order to recover from the erroneous computation, because they assume that every operation is unsafe and subject to a rollback. The Global Virtual Time (GVT) gives a lower bound on the timestamp of the earliest event that a logical process may receive. Therefore, any event processed earlier than the GVT is regarded as a committed because it will never be rolled back. For such events, the logical process can reclaim the memory used to store the associated state (or state changes if incremental state saving is used).

Research on PDES has been largely dominated by the studies of conservative and optimistic protocols, and comparison of their performance. Unfortunately, both types of protocols have their strengths and weaknesses. Efficiency of conservative protocols in parallel execution is limited by the amount of lookahead in the simulation model, which is equal to the difference between the Earliest Output Time (EOT) and the Earliest Input Time (EIT). Both EIT and EOT are known exactly only during run-time and in many real world applications, deriving bounds for the difference between these two values, which will define useable lookahead, is difficult to do. Besides, large number of null messages required to collaboratively advance the simulation clock in conservative protocols often incur significant overhead. As a result, parallelized execution may be slower than even the sequential one. On the other hand, optimistic protocols do not depend on lookahead and null messages, however, state saving usually requires storing and accessing large amounts of memory. This negatively impacts the speed of execution because of the relatively slow improvement in memory access speed within the current VLSI technology. The handling of anti-messages complicates the simulation model development. Furthermore, optimistic models may exhibit unexpected behavior caused by inconsistent messages resulting from rollback inconsistencies and stale states.

SUMMARY OF THE INVENTION

According to one aspect of the present invention, a method is provided for simulating a system. The method comprises acts of modeling the system using at least two processing entities, each of the at least two processing entities being capable of independently processing events, and wherein at least one of the at least two processing entities has a causal relationship with the other processing entity, and simulating the model, wherein the at least one of the two processing entities is permitted to process an out-of-order event received from the other processing entity.

According to one embodiment, the method further comprises an act of defining a lookback time that identifies a minimum time at which the out-of-order event may be processed. According to another embodiment, the act of defining the lookback time further comprises an act of defining a maximum time at which a rollback occurs to process the out-of-order event. According to another embodiment, the out-of-order event has an associated simulation arrival time, and wherein the act of simulating the model further comprises processing the out-of-order event prior to processing a local event having a simulation arrival time later than the simulation arrival time of the out-of-order event.

According to another embodiment of the invention, the act of simulating comprises an act of defining a set of possible events to be executed, and selecting an event having the smallest simulation arrival time as the only member of the set of possible events. According to another embodiment, the act of simulating comprises an act of executing the event having the smallest simulation arrival time from the set of possible events. According to another embodiment, the act of simulating comprises maintaining a first event list that stores weak events, and a second event list that stores strong events.

According to another embodiment of the invention, the act of simulating comprises an act of determining a minimum simulation time of a future-received event that can be processed out-of-order. According to another embodiment, the act of simulating comprises an act of processing the out-of-order event. According to another embodiment, the act of simulating comprises an act of determining, independently for each of the at least two processing entities, whether to process a local event without having to communicate event information to other processing entities.

Another aspect of the present invention is directed to a computer-readable medium having computer-readable signals stored thereon that define instructions that, as a result of being executed by a computer, instruct the computer to perform a method for simulating a system. The method comprising acts of modeling the system using at least two processing entities, each of the at least two processing entities being capable of independently processing events, and wherein at least one of the at least two processing entities has a causal relationship with the other processing entity; and simulating the model, wherein the at least one of the two processing entities is permitted to process an out-of-order event received from the other processing entity.

According to one embodiment of the invention, the method further comprises an act of defining a lookback time that identifies a minimum time at which the out-of-order event may be processed. According to another embodiment of the invention, the act of defining the lookback time further comprises an act of defining a maximum time at which a rollback occurs to process the out-of-order event. According to another embodiment, the out-of-order event has an associated simulation arrival time, and wherein the act of simulating the model further comprises processing the out-of-order event prior to processing a local event having a simulation arrival time later than the simulation arrival time of the out-of-order event.

According to another embodiment of the invention, the act of simulating comprises an act of defining a set of possible events to be executed, and selecting an event having the smallest simulation arrival time as the only member of the set of possible events. According to another embodiment of the invention, the act of simulating comprises an act of executing the event having the smallest simulation arrival time from the set of possible events. According to another embodiment, the act of simulating comprises maintaining a first event list that stores weak events, and a second event list that stores strong events. According to another embodiment, the act of simulating comprises an act of determining a minimum simulation time of a future-received event that can be processed out-of-order.

According to another embodiment, the act of simulating comprises an act of processing the out-of-order event. According to another embodiment, the act of simulating comprises an act of determining, independently for each of the at least two processing entities, whether to process a local event without having to communicate event information to other processing entities.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings:

FIG. 6A is a block diagram showing an example model, and FIGS. 6B and 6C show eager and lazy scheduling of events received at the example model, respectively;

DETAILED DESCRIPTION

All references referred to herein are incorporated by reference in their entirety.

According to one aspect of the invention, a lookback protocol is disclosed that provides another source of parallelism to increase simulation performance. Lookback can reduce the number of rollbacks in optimistic simulations, because a logical process may simply process an out-of-timestamp order event instead of rolling back other events. Lookback may also be used in conjunction with new conservative protocols, some of which may no longer depend on lookahead. As a result of implementing a lookback-based protocol in performing simulations, lookback-based conservative protocol execution time may be lower than the bound given by the critical times of events.

Generally, according to one aspect of the invention, lookback is defined as the ability of a logical process to execute out-of-timestamp order events, which are often referred to as stragglers, without impacting states of other logical processes. Below is provided a more formal definition of lookback according to one embodiment of the invention described below with respect to FIG. 1.

Definition 1: If a logical process (P1 (item 104)) at simulation time T (e.g., current simulation time 101) can execute correctly, without sending out anti-messages, any received event with timestamp between T−L and T, then the time window [T−L, T] is said to be the lookback window of the logical process at time T. The lower end of the lookback window, T−L, is referred to as the virtual lookback time (e.g., item 102 of FIG. 1). The procedure used to process events falling into the lookback window is called the lookback procedure. For convenience, the lookback window is sometime abbreviated to lookback (e.g., item 103). Finally, for any future event E at the given simulation time T, LB(E,T) denotes the function that defines the value of the virtual lookback time after the event E is executed at time T.

Figure 2:
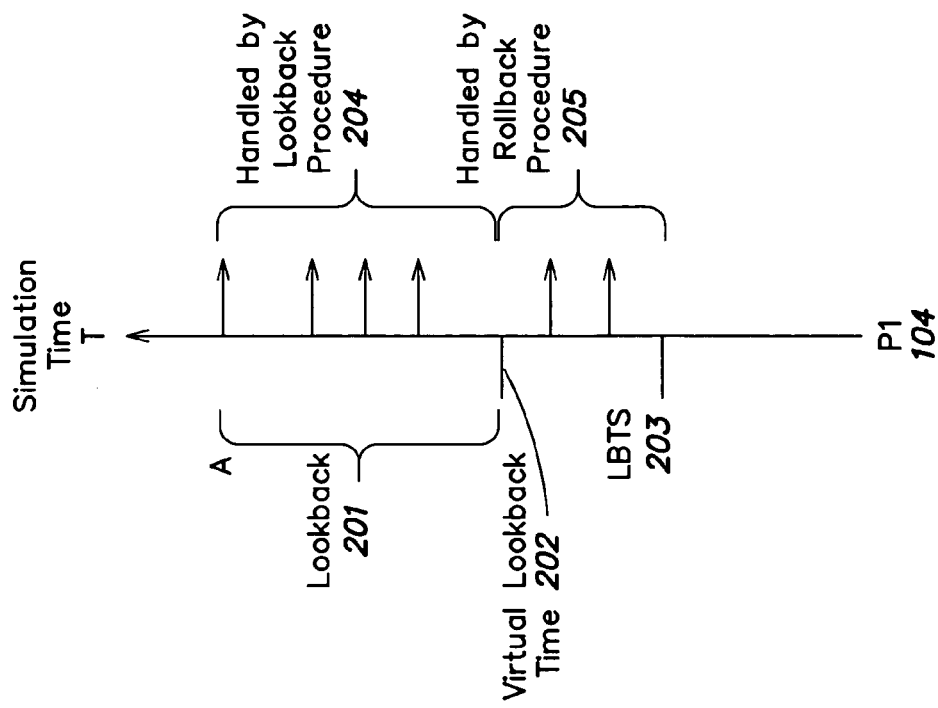
FIG. 2 is a diagram showing a relationship between rollback and lookback according to one embodiment of the invention.

This is shown in more detail in FIG. 2, which shows a lookback window 201. Any event received within the lookback window may be executed out of order (e.g., and therefore handled by a lookback procedure 204). Any events received later than the virtual lookback time 202 may be handled using a rollback procedure 205.

As defined, lookback is the property of a lookback procedure. Experience shows, however, that in many cases it is relatively easy to observe what effect each event has and what processing needs to be done for each event that falls into the lookback window. As a simple example, consider a logical process that simulates a server with a First-Come-First-Serve (FCFS) queue receiving tasks for processing and sending processed tasks to other logical processes. An arrival of a task in the logical process does not change the lookback, if the arriving task is placed in the queue according to its simulation arrival time. If the tasks arrive in the order of their simulation arrival times, then merely placing them in the FCFS order in the queue would suffice.

On the other hand, the departure of the task from the server sets the lookback virtual time to the simulation arrival time of the departing task, T. A newly arriving task with the simulation arrival time smaller than T, needs to be processed before the departing tasks, changing its departure time. Because the departing task carries its departure time to some other logical process, the change required in such a case is no longer local. Similar analysis of the processing of events within the lookback window and of an impact of each event on the virtual lookback time allows the simulation designer to define the correct lookback procedure and function LB(E, T).

To avoid any causality error, logical processes always maintain a virtual lookback time that is less than or equal to the timestamp of any future event. Under such circumstances, any received event can be successfully processed by either the regular event handler or the lookback procedure. Therefore, the lookback constraint is identified as follows.

Definition 2: A logical process obeys the lookback constraint if and only if after processing each event, the virtual lookback time is smaller or equal to the minimum timestamp value of all events that will arrive later. The lower bound on the timestamp of all the future events at the simulation time T is referred to as the Minimum Future Receive Time (MFRT(T)).

Figure 3:
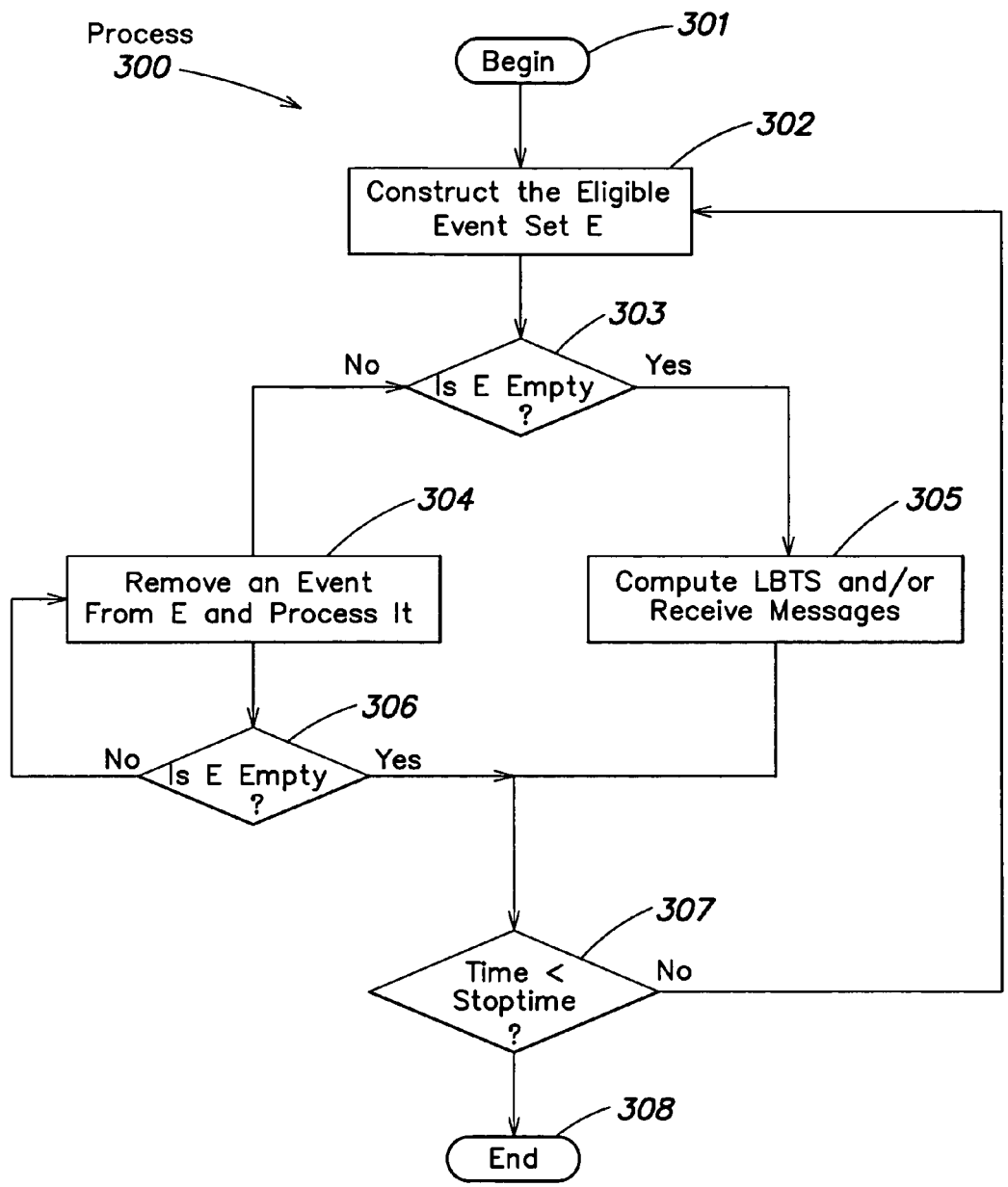
FIG. 3 is a flow chart of a process for processing events according to one embodiment of the invention.

The lookback constraint is generally a relaxation of the local causality constraint. Adherence to the lookback constraint enables a new kind of conservative protocols for the parallel discrete event simulation. A more general protocol 300 is described below with respect to FIG. 3, denoting by E(T) a set of future events that may be eligible for execution.

```
while (the termination condition is not met) (step 301)
    create E(T) according to some criteria (step 302)
    while (E(T) is nonempty ) (step 303)
        remove an event e from E(T) (step 304)
        success_flag := ( LB(e,T)≦MFRT(T)) (step 306)
        if success_flag process e
    end while
    if( success_flag = false ) recompute MFRT(T) (step 305)
end while (step 308)
```

This general lookback-based protocol first constructs a set of possibly eligible events E(T). It then repeatedly removes an event from E(T) and decides if this event can be processed according to the lookback constraint. Even if it cannot be processed, the while loop will continue to check the eligibility of other events in E(T). The MFRT is recomputed only when E(T) becomes empty and at no event has been processed.

The efficiency of creating the set E(T) is important for overall efficiency of simulation because this operation is repeated for each iteration. Simply, we can select the event with the smallest timestamp as the only member of E(T). Such a solution will minimize the amount of processing by minimizing the number of invocations of the lookback procedure which is usually more expensive that the regular event procedure. On the other hand, by ordering the future event list by the virtual lookback time of events and selecting the event with the smallest virtual lookback time as the only member of E(T) will also works well for simulations whose virtual lookback time is independent of the simulation time. This solution increases the parallelism of the simulation and minimizes the number of times MFRT is recomputed when the earliest event cannot be processed, but it may increase processing time because of the costly lookback procedure. The following distinction enables another efficient ordering of the future event list.

Definition 3: An event is said to be weak is if its execution doesn't change the lookback. Otherwise, it is called a strong event.

Apparently, a weak event is preferable to a strong event. We can then keep two separate future event lists, one for weak events and the other for strong events. The earliest event in the weak event list has a higher priority than the earliest event in the strong event list. An example will demonstrate the advantage of maintaining two event lists. Consider again a logical process with the server and the FCFS queue discussed earlier. Assume that at time T=10, the virtual lookback time is T=0 and there are two events in the local future event list. The first one is departure of task t1 at time T=12 and task t1 arrived at time T=8. The second one is arrival of task t2 in the system at time T=14. The departure event is strong, while the arrival event is weak. If we strictly obey the timestamp order, the first event cannot be processed when the MFRT is less than 8. On the other hand, the strong/weak distinction enables us to select the second event which will be processed successfully, irrespective of the value of the MFRT. If during this processing the event which caused MFRT to be less than 8 arrives, processing the weak event first will incur less wait. Hence, use of lookback enables a new non-traditional ordering of events in the future event queue, thereby increasing parallelism of the simulation.

Figure 5A:
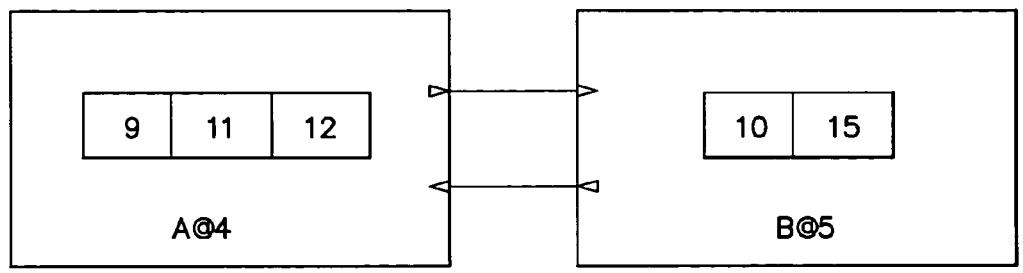
FIGS. 5A and 5B are diagrams showing deadlock in a LookBack Earliest Input Time (LB-EIT) protocol.
Figure 5B:
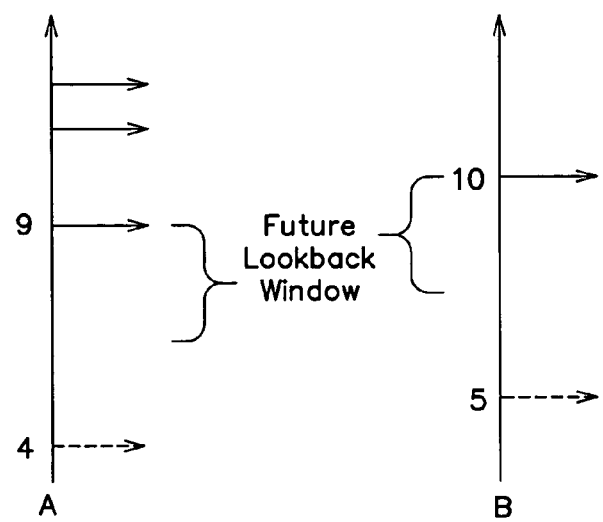

Two variants of the general lookback-based protocol may be implemented which always select the earliest event as the only member of E(T). These two variants differ in the estimations of the MFRT: one uses GVT (Global Virtual Time) and the other is based on an EIT (Earliest Input Time), abbreviated as LB-GVT and LB-EIT, respectively. The LB-GVT protocol keeps a global estimation of the MFRT as equal to GVT. Hence, LB-GVT does not take into account the interconnections between logical processes. As a result GVT is a crude estimation of the MFRT. In contrast, the LB-EIT protocol requires that each logical process maintain its own estimation of the MFRT based on the topology of the interconnections, thus, helping to improve the accuracy of the estimation. However, as can be seen below, the LB-EIT is prone to deadlock. FIGS. 5A and 5B are diagrams showing deadlock in a LB-EIT protocol.

LB-GVT Protocol

Theorem 1: LB-GVT is deadlock-free, if the GVT is accurate, i.e. the GVT is equal to the smallest timestamp in the simulation.

Proof: Denote the timestamp of the earliest event(s) in the system by t. An event with timestamp t cannot cause a causality error, because the lookback constraint always holds before such an event arrives, which implies the virtual lookback time $vlt \leq gvt = t$. We need to show that the lookback constraint still holds after processing such an event. The fact that the lookback is non-negative implies that after the processing, $vlt \leq t$. Since $t = gvt$, we have $vlt \leq t = gvt$. The lookback constraint, which requires $vlt \leq gvt$, is not affected and any event with the smallest timestamp t can be safely processed. Therefore, any deadlock cannot possibly exist.

LB-EIT Protocol

Let us look at a simple example to see the challenge of implementing the LB-EIT protocol. As shown in FIG. 5, there are two logical processes (LPs), A and B, exchanging events with each other. Their current simulation times are 4 and 5, respectively. For simplicity, assume a constant lookback of 3 for both logical processes. Each logical process also has other future events in the event list, with much larger timestamps. The EIT of 5 in LP A prevents the future event at time 9 from being processed, because the execution of the event at time 9 would change the virtual lookback time to 6, but LP A conservatively assumes that LP B may send it an event with timestamp less than 6. For LP A to be able to process this event, LP B must inform LP A about its progress beyond the logical time 6 to enable LP A to update its EIT. But LP B cannot do so since it has no event to process either (event execution may change the EIT in other logical processes). A dependency cycle is formed and the simulation cannot progress.

Figure 1:
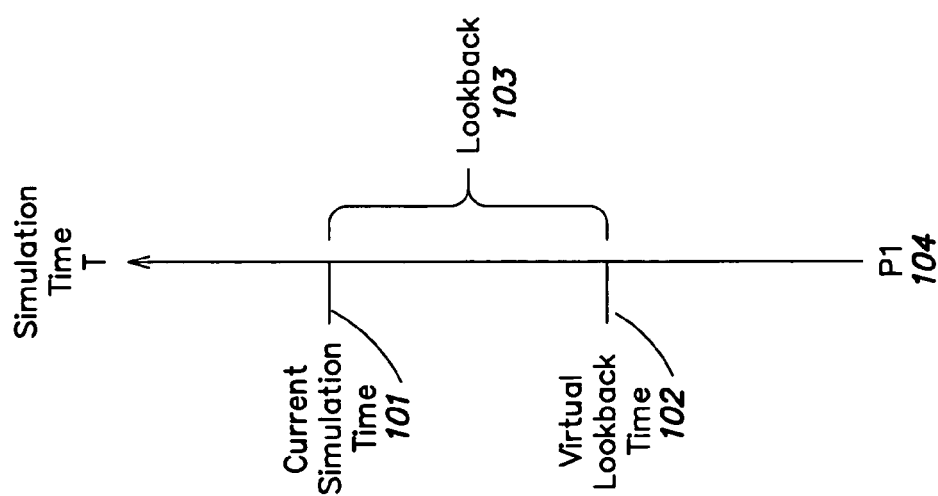
FIG. 1 is a diagram illustrating the concept of lookback according to one embodiment of the invention.

FIG. 1 shows deadlock in an LB-EIT protocol. The situation shown in FIG. 5 is exactly the same as what happens with the null message protocol when no knowledge of lookahead is utilized. A cycle of logical processes, in this case LP A and LP B, whose EITs depend on each other, contains no events in their lookback windows, while no future events in their event lists can be processed. There is no global mechanism to inform them of this deadlock situation. Consequently, every logical process is assuming that the earliest event will come from other logical processes.

We conclude that the LB-EIT protocol still requires the knowledge of lookahead to break up potential deadlocks. In the example given above, suppose each logical process has lookahead of 2. By several rounds of sending and receiving null messages, these two logical processes can gradually increase their EITs so that the events at 9 and 10 eventually become eligible for processing.

Simulation System

Various embodiments according to the invention may be implemented on one or more computer systems. These computer systems, may be, for example, general-purpose computers such as those based on Intel PENTIUM-type processor, Motorola PowerPC, Sun UltraSPARC, Hewlett-Packard PA-RISC processors, or any other type of processor. It should be appreciated that one or more of any type computer system having one or more processors may be used to simulate a parallel discrete event system according to various embodiments of the invention. Further, the simulation system may be located on a single computer or may be distributed among a plurality of computers attached by a communications network.

A general-purpose computer system according to one embodiment of the invention is configured to perform a simulation using lookback. It should be appreciated that the system may perform other functions, including one or more additional coordination protocols, and the invention is not limited to having any particular function or set of functions.

Figure 4A:
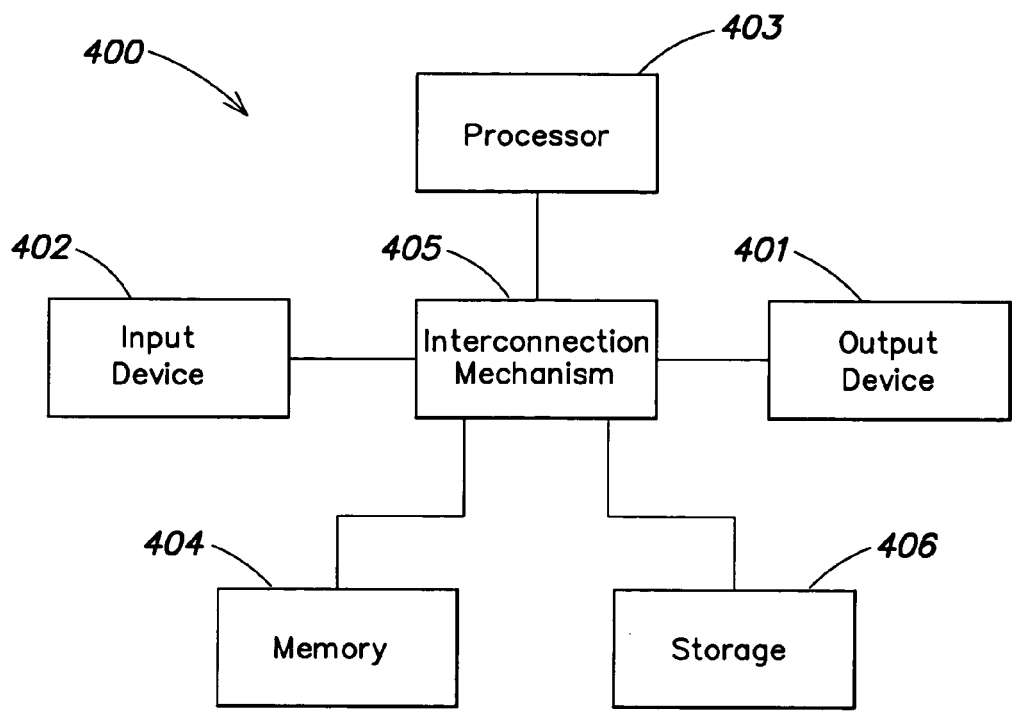
FIG. 4A is a block diagram of a simulation system according to one embodiment of the invention.

For example, various aspects of the invention may be implemented as specialized software executing in a general-purpose computer system 400 such as that shown in FIG. 4A. The computer system 400 may include a processor 403 connected to one or more memory devices 404, such as a disk drive, memory, or other device for storing data. Memory 404 is typically used for storing programs and data during operation of the computer system 400. Components of computer system 400 may be coupled by an interconnection mechanism 405, which may include one or more busses (e.g., between components that are integrated within a same machine) and/or a network (e.g., between components that reside on separate discrete machines). The interconnection mechanism 405 enables communications (e.g., data, instructions) to be exchanged between system components of system 400. Computer system 400 also includes one or more input devices 402, for example, a keyboard, mouse, trackball, microphone, touch screen, and one or more output devices 401, for example, a printing device, display screen, speaker. In addition, computer system 400 may contain one or more interfaces (not shown) that connect computer system 400 to a communication network (in addition or as an alternative to the interconnection mechanism 405.

Figure 4B:
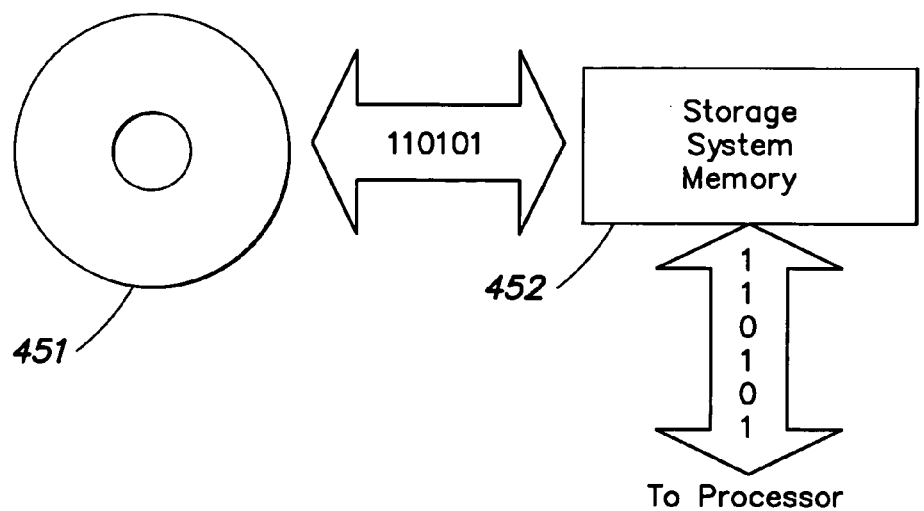
FIG. 4B is a block diagram of one embodiment of the storage system illustrated in FIG. 4A.

The storage system 406, shown in greater detail in FIG. 4B, typically includes a computer readable and writeable nonvolatile recording medium 451 in which signals are stored that define a program to be executed by the processor or information stored on or in the medium 451 to be processed by the program. The medium may, for example, be a disk or flash memory. Typically, in operation, the processor causes data to be read from the nonvolatile recording medium 451 into another memory 452 that allows for faster access to the information by the processor than does the medium 451. This memory 452 is typically a volatile, random access memory such as a dynamic random access memory (DRAM) or static memory (SRAM). It may be located in storage system 406, as shown, or in memory system 404, not shown. The processor 403 generally manipulates the data within the integrated circuit memory 404, 452 and then copies the data to the medium 451 after processing is completed. A variety of mechanisms are known for managing data movement between the medium 451 and the integrated circuit memory element 404, 452, and the invention is not limited thereto. The invention is not limited to a particular memory system 404 or storage system 406.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 400 is shown by way of example as one type of computer system upon which various aspects of the invention may be practiced, it should be appreciated that aspects of the invention are not limited to being implemented on the computer system as shown in FIG. 4A. Various aspects of the invention may be practiced on one or more computers having a different architecture or components that that shown in FIG. 4A.

Computer system 400 may be a general-purpose computer system that is programmable using a high-level computer programming language. Computer system 400 may be also implemented using specially programmed, special purpose hardware. In computer system 400, processor 403 is typically a commercially available processor such as the well-known Pentium class processor available from the Intel Corporation. Many other processors are available. Such a processor usually executes an operating system which may be, for example, the Windows 95, Windows 98, Windows NT, Windows 2000 (Windows ME) or Windows XP operating systems available from the Microsoft Corporation, MAC OS System X available from Apple Computer, the Solaris Operating System available from Sun Microsystems, or UNIX available from various sources. Many other operating systems may be used.

The processor and operating system together define a computer platform for which application programs in high-level programming languages are written. It should be understood that the invention is not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems (not shown) coupled to a communications network. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP).

It should be appreciated that the invention is not limited to executing on any particular system or group of systems.

Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

Lookback in Simulation Models

As discussed above, the concept of a lookback and sketched two synchronization algorithms for Parallel Discrete Event Simulation (PDES) were introduced that rely upon the existence of lookback. The key question related to the usefulness of these two synchronization algorithms is, how common is the lookback in real world simulations? This question may be answered by presenting two arguments. First, it is identified that lookback, the ability to change the past, is not limited to the models where events are independent of each other. Second, it is identified that lookback is more commonly observed than lookahead.

Lookback and Out-of-Timestamp Order Execution in Optimistic Protocols

The most perfect lookback might be that of linear systems. It has been demonstrated that the superposition property of a linear system can be used to process a straggler without a rollback. Instead, a new copy of the current system is initialized with all state variables set to zero. This newly created copy is run with the straggler as the input from the timestamp of the straggler to the current simulation time. Finally, the correct state information is created by summing up the state variables in the original system with those in the new copy. The interesting fact is that the values of the state variables may be corrected at the current simulation time without ever recreating their values at the simulation time when the straggler is bound to execute.

In the PDES community, it has been noticed by many researchers that in some special circumstances events can be processed in out-of-timestamp order. Several attempts have been made to exploit this possibility in the context of independent event sets, defined in such a way that events in different sets do not affect each other. Independent events are commutative, i.e., the order in which the independent events are processed does not affect the correctness of the simulation.

Query events, proposed by Sokol, are the simplest form of independent events. They do not change the internal state of the logical process, and therefore can be safely processed even if the local simulation time is larger than their simulation time (i.e., when they are formally stragglers), by simply reading the state history, instead of rolling back the entire logical process. Other events are then called side-effecting events and require a rollback if they are received after the local simulation time progressed beyond the time at which they were supposed to be scheduled.

Rollback relaxation is a similar technique. Logical processes can be classified into memoried processes and memoryless processes. In the former, the output messages are computed as a function of both input messages and internal state variables, while in the later only the input messages are used. Consequently, in memoryless processes rollback relaxation is able to process stragglers without state-saving.

Weak Causality is a formal notion defining the event dependency which simplifies the detection of independent events. Traditionally, causality is defined in terms of the happened-before relation. The Weak Causality relation is based on the conflicts created by events that operate on the same data, instead of on the timestamps of events.

Leong and Agrawal have proposed a semantics-based optimistic protocol that exploits the semantics of messages to avoid certain types of rollback. For example, the commutativity relation determines if two events can be executed out of order, while the invalidated-by relation determines whether a processed event should be rolled back due to the arrival of another event with a smaller timestamp. However, even for sets, the data structure for which relations between different types of message were discussed in their paper, this protocol is complex. Their work cannot be easily extended to other general simulation models.

All previous attempts trying to exploit the independence between events have one thing in common: upon arrival of a straggler, they first check by some means whether the straggler can be safely handled (the check is most likely done by the simulation engine). If the straggler can be processed, the same procedure that processes positive messages is invoked. Otherwise, a rollback-recovery procedure is invoked. In a word, the event independence is used only to reduce the number of rollbacks.

In contrast, lookback-based protocols according to various embodiments of the invention handle stragglers in a different way. First, the logical process determines whether a straggler can be safely processed according to the notion of lookback. A different procedure, the lookback procedure, is invoked to process stragglers whose timestamp is within the lookback window. The lookback procedure effectively carries out two operations. First, the lookback procedure tries to repair the damage caused by the wrong order of event execution. Second, the lookback procedure processes the straggler based on the state that has been repaired. Not only does this approach reduce the number of rollbacks, it may also completely eliminate rollbacks. By adhering to the lookback constraint, the protocol guarantees that all stragglers will be correctly processed by the lookback procedure, thus eliminating the need for the rollback and recovery procedure.

When the lookback procedure is used to deal with independent events, it is apparent that the repair operation is no longer needed. How well it will handle dependent events depends on its ability to repair the damage. It is intuitive that any changes made to the local state of the logical process can be recovered by some means, but the sent messages can be only cancelled out by sending anti-messages. The following definition specifies a universal lookback procedure that is able to correctly process stragglers except in the case where new events generated in the erroneous computation have been delivered to other logical processes.

Definition 4. A universal lookback procedure requires every logical process to save the list of processed events and every change made to the state by each event. Upon arrival of a straggler, it rolls back all processed events with a timestamp larger than the timestamp of the straggler, in decreasing timestamp order. Then, it processes the straggler, and finally re-execute the events that have been rolled back, in increasing timestamp order.

Clearly, the lookback-based protocol adopting the universal lookback procedure belongs to the class of local rollback mechanisms. Anti-messages are strictly avoided but local state-saving is still required. This also implies that the aforementioned lookback-based protocols unify two previously known synchronization techniques, out-of-timestamp order execution and local rollback. When out-of-timestamp order execution of events is allowed, the discrepancy between the simulation times in different processors can be smoothed out by the logical processes on the boundary of processing elements, by means of local rollback. All other logical processes observe no stragglers or anti-messages. This suggests that lookback-based protocols allow for aggressiveness, but not risk. Two such protocols previously known, SRADS with local rollback and Breathing Time Window, must require logical processes to work collaboratively, by exchanging event information, to avoid sending any erroneous message. In lookback-based protocols, however, each logical process can determine alone whether an event can be sent out.

The universal lookback procedure deals with the worst case of event dependence. It is possible that no state, or only a small portion of the entire state need to be saved to enable a logical process to process the stragglers, as is the case of the Closed Queuing Network simulation that we will discuss later. In some models, when the lookback procedure is used to reduce the number of rollbacks in optimistic simulations, only an extra variable might be needed to store either the value of the virtual lookback time or the size of the lookback window. Below is an example of a Personal Communication Service (PCS) simulation for such a case.

In a PCS system, a number of portables (or cellular phones) are roaming around a geographical area which is partitioned into cells. Each cell contains a base station that transmits wireless signals with the portables through a number of channels. Portables residing within the same cell must compete for the channels in the cell. To exploit the lookback, we define the virtual lookback time of a cell as the last simulation time at which a portable released the last unoccupied channel. As soon as a portable gets the last available channel, we set the lookback to zero (which means that the virtual lookback time becomes equal to the current simulation time of the cell). One can easily prove that for any time instant in the lookback window there is at least one channel available. Therefore, a portable arriving from other cells in the simulation past but within the lookback window can be guaranteed a channel, without affecting other portables. To preserve the correctness, we must also set the lookback to zero after processing a straggler that grabs the last available channel.

The PCS simulation actually represents a general type of applications in which a number of mobile objects compete for the limited quantity of resources within each process. Even if each object reads and writes to the same variable representing available resources, which implies dependence among events, a certain degree of out-of-timestamp order execution is still possible. The effectiveness of lookback-based improvement largely depends on the availability of resources. For example, in the PCS simulation, if we assume a blocking rate of 5%, when a straggler arrives, 5% of times it finds no channel, but for the remaining 95% of arrivals, we are able to process it by the lookback procedure. Consequently, the number of rollbacks would decrease by the order of 20. Yet, the more important implication is that existence of a lookback might be much broader than expected.

Lookback and Lookahead

To understand the relationship between lookback and lookahead, we must first turn our attention to two different scheduling mechanisms for delivering inter-logical process events. The distinction between eager and lazy scheduling was motivated by Fujimoto's notion of eager and lazy server. In eager scheduling, an inter-logical process event is sent out immediately when it is generated. Such an event usually contains a timestamp larger than the current simulation time of the sender. In lazy scheduling, an event is sent out only when the simulation clock reaches the timestamp of the event. Therefore the timestamp of any outgoing event is always equal to the current simulation time of the sender.

In FIGS. 6A–C, we consider an example of an FCFS server using two scheduling scheme, eager scheduling (FIG. 6B) and lazy scheduling (FIG. 6C). Suppose a sequence of tasks arrive at times 4, 5, 6.5 and 7.5. The FCFS server has a constant service time of 2 time units for all tasks. With eager scheduling, the departure event for each task can be scheduled and sent to the sink as soon as the task arrives, because of the nature of the FCFS server. Here, the lookahead is exploited to the maximum degree. For instance, when the task A arrives at time 7.5, it can be immediately calculated that it will depart at time 12, so the lookahead is 12−7.5=4.5. On the other hand, lookback does not exist, because at the moment of the event departure from the server, the effect of the processed event becomes permanent and cannot be recovered.

In lazy scheduling, the departure event is not immediately sent to the sink. Instead, it is held in the server's event list until the current simulation time is equal to its timestamp. This delay gives the logical process a chance to retract a departing event in case an arrival event with a timestamp smaller than the arrival timestamp of the departing task is received later. In such a case, the previously scheduled departure time should be changed after scheduling the departure event of the newly arriving task first. Lookback is the largest if the scheduled departure event is sent out as late as possible. Therefore, lookback-based protocols prefer lazy scheduling.

We must be careful in defining the lookahead under the lazy scheduling. Traditionally, there are two definitions of lookahead. One defines the lookahead of t at simulation time T as the ability to schedule an event no earlier than at time t+T. The other defines lookahead as the difference between the EOT and the EIT. As we saw earlier, under the lazy scheduling the scheduled event is not sent immediately, thus sending out becomes the separate event on the future event list. For example, when the task arrives at time 7.5, the next event under lazy scheduling (and the next output time) is 8, not 12. So the lookahead is only 0.5.

How much is the lookback in an FCFS server? We can see that when the task A leaves the server at time 12, the virtual lookback time is changed to the arrival time of the task A, which is 7.5. Indeed, any task arriving at the simulation time later than 7.5 can be simply inserted into the waiting queue. However, a task scheduled to arrive earlier than 7.5 would force a causality error, because it is this task that must leave the server at simulation time 12, not task A. The lookback window size is therefore 12−7.5=4.5. Interestingly, the lookback under lazy scheduling is equal to the lookahead under eager scheduling in this case. This is by no means a coincidence, but rather implies that there is a relation between lookback and lookahead. A part of this relationship is captured in the following two theorems.

Theorem 2: If under eager scheduling, a simulation contains lookahead L at simulation time T, then under lazy scheduling this simulation contains lookback of at least L at time T+L.

Proof: Under eager scheduling, a logical process is said to contain a lookahead of L at simulation time T if it can only schedule new events with timestamp of at least T+L. Consider this simulation under lazy scheduling using a lookback-based protocol. Suppose at simulation time T+L a straggler arrives with a timestamp within [T, T+L]. Since this straggler arrives no earlier than time T, any message that it produces must contain events with the simulation time larger or equal to lookahead at time T, which is T+L, so these messages will be placed on the future event list. Any message that leaves the logical process within time [T,T+L] under lazy scheduling must have been produced by an event at the simulation time less than T, otherwise the lookahead could not have been L, so such a message cannot be affected by this straggler. Hence, no messages will be sent out during processing of such stragglers, and the associated operations of the universal lookback procedure, which only change the state of the logical process, are always valid.

Now, it is determined that lookback is at least as common as lookahead. Whenever lookahead exists, lookback is also available. Can lookback exist without lookahead? The following theorem answers this question positively.

Theorem 3: Lookback may exist even when lookahead is zero.

Proof: We give a simple example to support this claim. Assume a zero delay logical process whose only function is to copy any received message from an input port to an output port. Apparently there is no lookahead in the logical process, because messages can arrive at any time and they leave immediately. The lookback, however, is infinite. The logical process can accept messages with any timestamp no matter what is its current simulation time.

Theorem 2 and Theorem 3 together tell us that existence of lookback could be more commonly observed than that of lookahead. That does not necessarily mean that they exclude each other. With lazy scheduling, a logical process can still inform others of its next output time without sending the actual event, as stated by the theorem below.

Theorem 4: Under lazy scheduling, if at the current simulation time T a logical process can predict that no message will be sent for the next L simulation time units, then the lookahead at time T is equal to L and the lookback window at time T+L is at least L.

Proof: By definition, lookahead at time T is L, because the Earliest Output Time is at least T+L. Also, when the simulation clock advances to T+L, under lazy scheduling, the process can, using the universal lookback procedure, execute any events received within the time [T, T+L], as described in the proof of Theorem 2. Thus, the future time window L becomes part of the lookback window.

Theorem 4 allows us to define a new mechanism to exploit both lookback and lookahead at the same time. According to the above definitions and theorems, lookback is a dual of lookahead: lookahead is the ability to predict the future, while the lookback is the ability to change the past. At the first glance they seem to be completely unrelated. Nevertheless, when we are able to advance the simulation clock more aggressively, the future becomes the past. The relations between lookahead and lookback dictated by the above three theorems are then easy to understand. There is still a subtle difference between them; while the lookahead is used by a logical process to inform others of the change on its earliest output time, the lookback allows the logical process to process more events, without changing its earliest input time. Therefore, we conclude that lookahead exploits inter-logical process parallelism, while lookback exploits intra-logical process parallelism.

Lookback and Super-Criticality

Figure 7A:
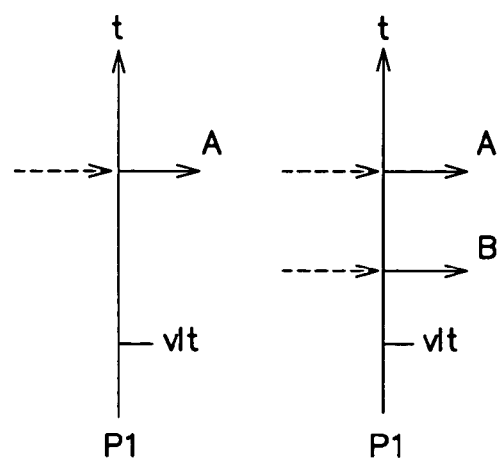
FIGS. 7A–7B are diagrams showing super-criticality of lookback-based protocols.
Figure 7B:
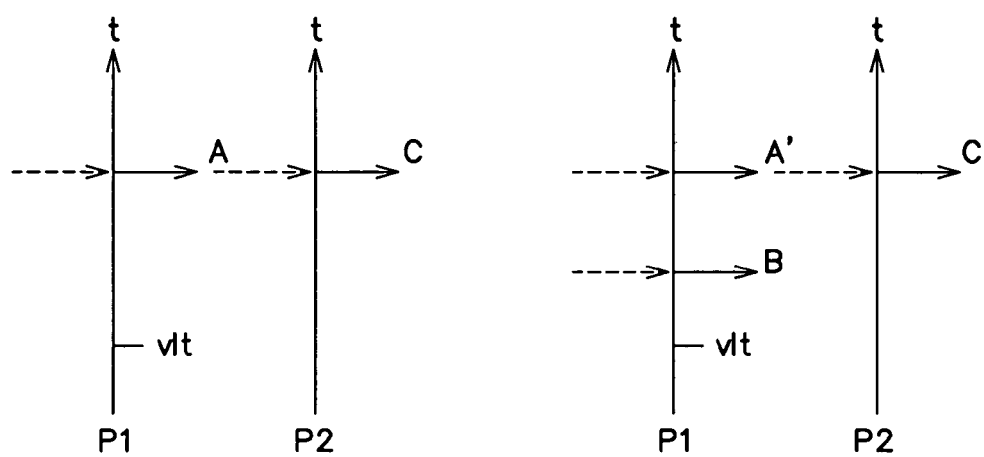

Are lookback-based protocols, namely LB-GVT and LB-EIT, conservative or optimistic? This is the distinction we must first make in order to study the super-criticality of lookback-based protocols. The use of the universal lookback procedure makes them more or less like optimistic, but since there exist models in which no state-saving is required to exploit lookback, we argue that the optimism of lookback-based protocols varies with the selected model. At least for those models requiring no state-saving, the lookback-based synchronization should be undoubtedly characterized as conservative. There is a unanimous opinion that conservative protocols cannot beat the critical path bound on execution time. However, we will show that this is not true for lookback-based protocols. For the convenience of discussion, we denote the starting time of an event e by start(e), the completion time by complete(e), and the critical time by critical(e). There are two cases in which lookback-based protocols can produce super-critical speedup as shown in FIGS. 7A–7B.

An example of the first case is depicted in 7(a), in which we assume that the event A executes first. Later, another event B is received with a timestamp smaller than that of A but greater than the virtual lookback time. The event B can then be processed safely by the lookback procedure. For this case, assume that these two events are independent of each other. Thus, when processing the event B, the lookback procedure doesn't need to correct the logical process state reached after the execution of the event A. Apparently, the event A completes even before the event B starts execution. For simplicity, assume that the event B is on the critical path, i.e., complete(B)=critical(B), and therefore complete(A)<start(B)<complete(B)=critical(B)<critical(A), so complete(A)<critical(A), which is the sufficient condition for super-criticality described by Srinivasan et al. in the journal article entitled "Super-Criticality Revisited, in Proceedings of the $9^{th}$ Workshop on Parallel and Distributed Simulation, 1995, Lake Placid, N.Y.

In the other case depicted by 7(b), the two events A and B are no longer independent. Rather, after processing the straggler B, we have to repair the incorrect state produced by the first execution of the event A. Therefore complete(A)>complete(B). But the event C created by the first execution of the event A is not affected. We say that the event C is independent of the event B for this reason. Again, if we assume that the event A is on the critical path, then complete(C)<complete(B)<complete(A)=critical(A)<critical(C), or complete(C)<critical(C), which proves the event C is a super-critical event.

Prior research by Jefferson and Reiher have proven that all conservative mechanisms are bound by the critical times of events but under the assumption that all correct conservative simulation mechanisms must use elementary scheduling. In it, for all pairs of committed events e and e', whenever e is either the predecessor of e' or the antecedent of e', then complete(e)≦start(e'). The authors claim that otherwise the simulation might be incorrect. For convenience, we reproduce the relevant part of their proof here:

Either e is the predecessor or the antecedent of e'. If e is the predecessor of e', then the last instruction of e might create a side-effect that affects the process state for event e'. If e' is started before e finished, then it cannot execute in the context of the exact state produced by e; the last instruction of e might produce a state change upon which e' depends. Hence e' might execute incorrectly.

Likewise, if e is the antecedent of e', then any mechanism that would start to execute e' before finishing e must in effect be "guessing" that e' will be scheduled at the end of event e, and also "guessing" what the parameters from e to e' would be. (Recall our assumption that e can only send the event message to schedule e' at the very end of e's execution.) Since those guesses might be wrong, the simulation might be incorrect.

In the first part, Jefferson and Reiher did not consider the feasibility of mechanisms that can ensure that stragglers can always be executed correctly. The lookback-based protocol is one of such mechanisms. It guarantees that once an event is about to execute, all predecessors of this event, if there are any, can also be processed correctly. If it cannot make such a commitment, the event processing has to be delayed.

In the second part of the quote, guessing is not the only mechanism that can allow the logical process to start executing an event before finishing its antecedent. The failure to consider other possibilities results from the traditional approach, as pointed out by Gunter in the Journal article entitled "Understanding Supercritical Speedup," in Proceedings of the 1994 Workshop on Parallel and Distributed Simulation, 1994, Edinburgh, Scotland, which views events as atomic. As in the example of 3(b), the event A is executed two times, one by the regular event procedure and the other by the lookback procedure, and the event C, produced by the first execution of the event A, is guaranteed to be correct by the notion of the lookback. If it were not, the event A would fail to be processed in the first execution and would delay its first completion, because no sent out event can be rolled back.

It is worth to note that lookback is limited by the message dependence introduced by Gunter in the article noted above. Informally, a message, created by an event e, is dependent on a set of events E, which influence e, if this message would be different if any event in the set E had not been executed. In this case, the event e cannot be executed before any event in the set E, because it would send out an incorrect message which cannot be cancelled. However, if we allow anti-messages, such a limitation would no longer exist. This suggests an interesting future research direction which extends the lookback-based protocols by introducing anti-messages. It also indicates the close link between lookback and lazy cancellation. Lazy cancellation determines whether or not an anti-message is necessary by comparing the positive message newly generated by the rollback and recovery procedure with the positive message that has already been sent out. If they are the same, there is no need to send the anti-message. In contrast, when lookback is applied to optimistic simulation, it determines the necessity of an anti-message by comparing the timestamp of the straggler with the virtual lookback time. If it the straggler timestamp is within lookback window, then the lookback procedure can handle the straggler and no anti-messages need to be sent. Otherwise, the rollback and recovery procedure is invoked and the corresponding anti-messages are sent. To make this decision, lookback uses only one floating-point number comparison, avoiding the high overhead of message comparison associated with lazy cancellation.

Closed Queuing Network Simulation

This network may be simulated by a simulation system according to one embodiment of the invention, the network having switches and FCFS servers. A Closed Queuing Network (CQN) as shown in FIG. 4 may be simulated, the CQN including three switches and nine FCFS servers, for example. Each task traveling through one of the FCFS server tandems eventually reach a switch. The switch will then dispatch the task to one of the tandems randomly.

Lookback-based protocols are well suited for the CQN simulation. The lookback of the switch is infinite. The virtual lookback time of the FCFS server is always equal to the receive time of the last task leaving the server. Any task received with a timestamp smaller than that of the current task in service must preempt the later. All those with a timestamp greater than or equal to the virtual lookback time can be correctly inserted into the waiting queue at positions defined by their timestamps. Tasks with timestamp smaller than the virtual lookback time will trigger a causality error. But such errors are preventable; when a task is about to leave the server, its receive time must be checked against the MFRT. If the receive time is greater than the MFRT, it means that another task with a smaller timestamp may arrive later. The task cannot be sent out, and the event processing is suspended.

Bagrodia and Liao proposed a technique to reduce the rollback distance for optimistic CQN simulation. They distinguished between the receive time of a task and the time at which a task can be served. When a straggler task arrives, the logical process needs to be rolled back only to the earliest time this message can be served. This approach bears some resemblance to the lookback-based protocols; for both algorithms are based on the observation that rollback to the timestamp of the straggler is unnecessary. They didn't realize that the straggler can be totally eliminated by deliberately advancing the simulation clock.

The lookback in the FCFS server requires no state-saving; the right position for a straggler task can be found by an insertion operation on an already sorted task list. However, if the buffer of the queue is finite and as a result may drop some tasks, modeling for lookback-based protocols is no longer trivial. Extra consideration must be taken in order to determine the right task to drop. In the traditional FCFS server, for instance, any task received after the queue size reaches the maximum limit must be discarded. This is not the case when a straggler arrives in a FCFS server that makes use of lookback. Indeed, another task in the queue with a receiving timestamp greater than that of the straggler may be removed from the queue. The search for such a task could be very difficult and we use an alternative in which the dropping decision is made when a task is about to be serviced.

The algorithm works as follows. Each task is associated with an integer variable to indicate its position in the queue when it arrives. The departure time of every task is saved in a linked list. Of course, we can periodically discard those entries in the departure time list that have timestamps smaller than the MFRT value. The position of a non-straggler task is equal to the size of the queue before it is inserted. The position of a non-straggler task that is immediately put into service because of an empty queue is −1. The position of a straggler task with receiving timestamp t is equal to the size of the queue, minus the number of tasks that have receiving timestamp larger than t, plus the number of tasks that have already left but with the departure timestamp larger than t. When a straggler task is inserted in the queue, all tasks with a larger receiving timestamp must have their position increased by 1. When the server is in need of a task, it should check if the position of the next task is equal to or greater than the maximum queue size. If so, the task must be dropped and every task in the queue must have their position decreased by 1. The next task is then checked and the same procedure repeats until a task is found.

Such a lookback procedure has some features of an optimistic simulation. The departure time of each task must be saved to enable calculating the position of stragglers. The departure times smaller than the MFRT can be discarded, which resembles fossil collection. However, only the time, not the departure event, needs to be saved. The memory consumed is therefore much less than in the optimistic simulation.

Performance of the two lookback-based protocols, LB-GVT and LB-EIT, may be tested, for example, on the CQN simulation. The simulation may be conducted as follows: assume the queue capacity is infinite, and then added the dropping control algorithm described above (no tasks are actually dropped to avoid the effect of decreasing number of tasks). All experiments are conducted on a 500 Mhz Quad Pentium III machine. Four CPUs are used in the parallel execution. Implicit heap queue is used to maintain the simulation event list.

Figure 8:
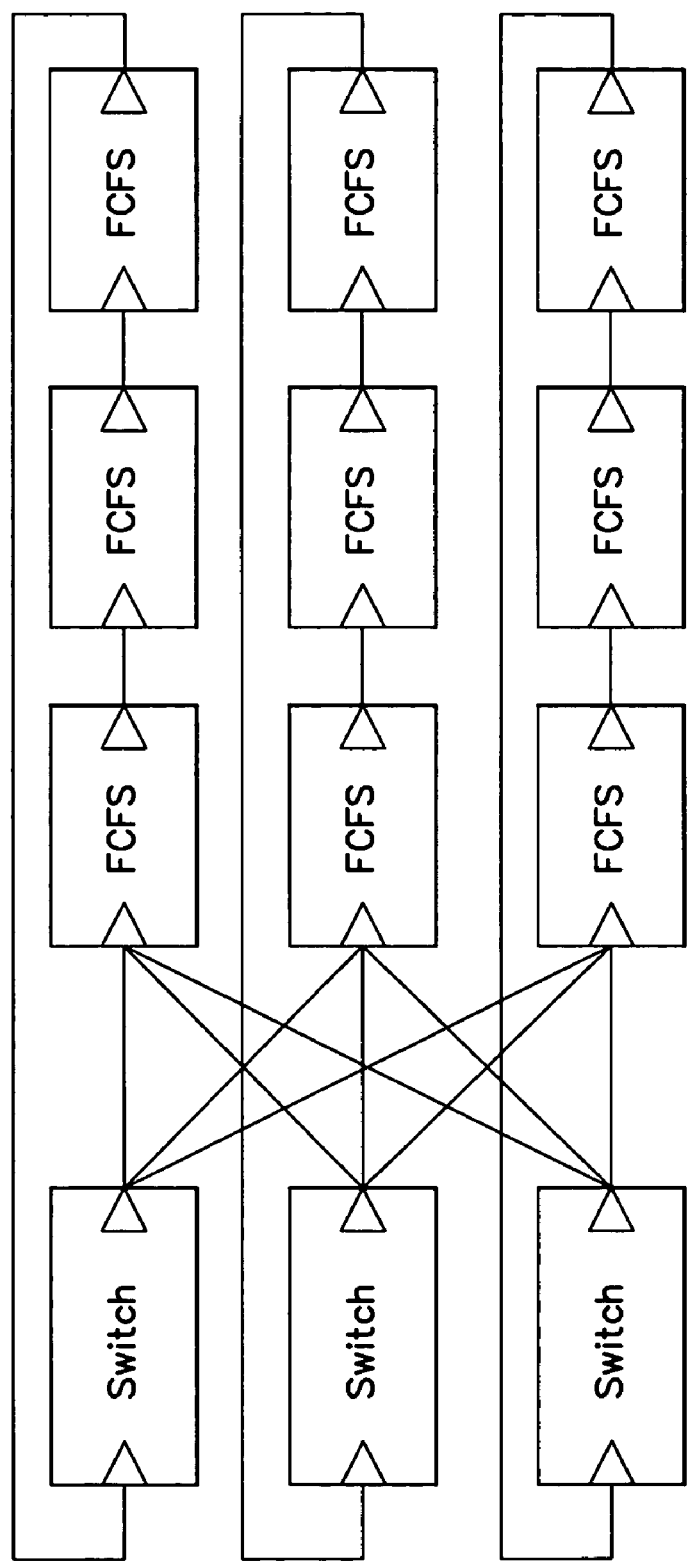
FIG. 8 is an example of a closed queuing network (CQN) that may be simulated according to one embodiment of the invention.
Figure 9:
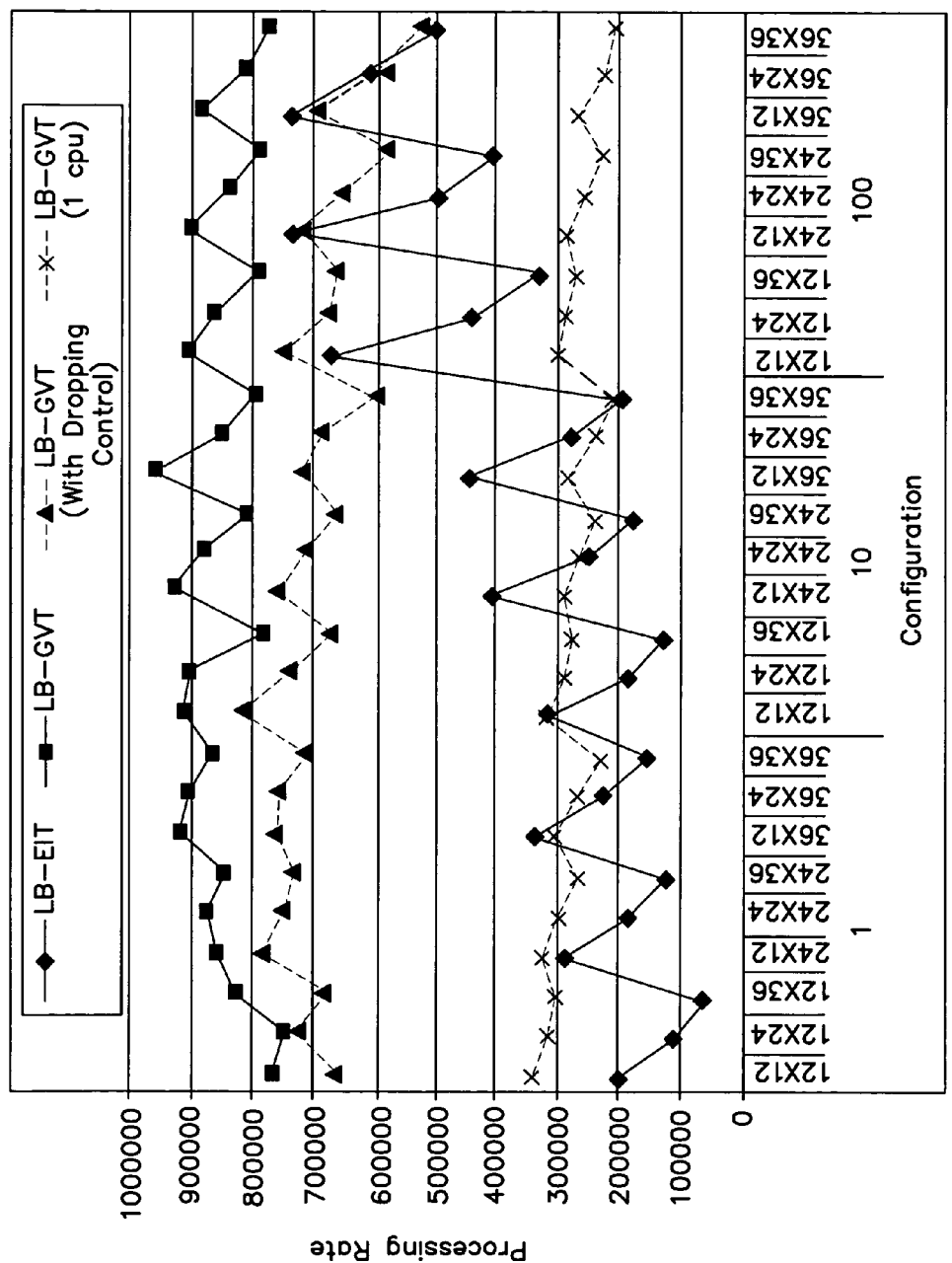
FIG. 9 is a chart showing the performance of lookback-based protocols used in a simulation of the CQN of FIG. 8.
Figure 10:
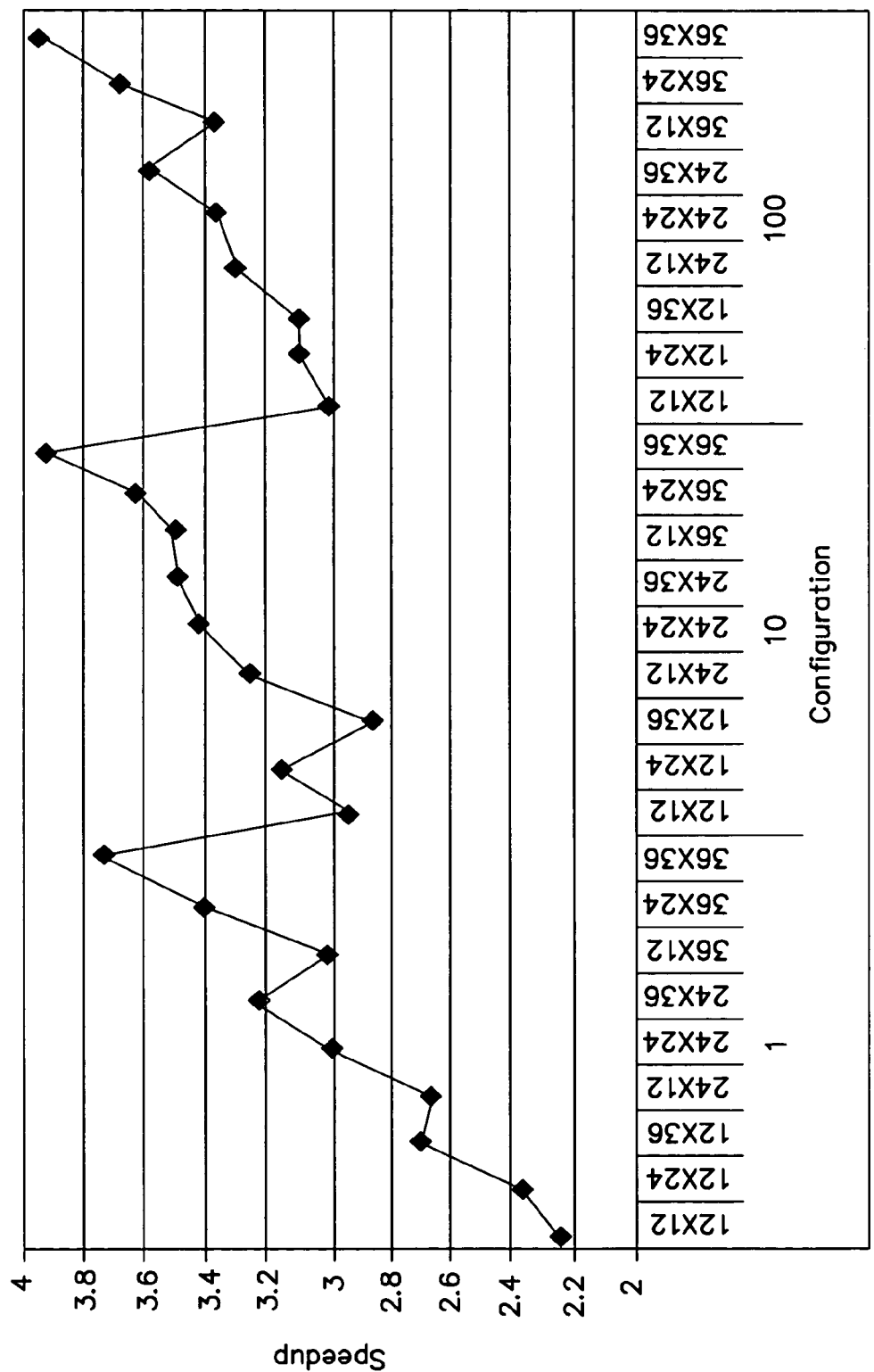
FIG. 10 is a chart showing a speedup in performance of a Lookback Global Virtual Time (LB-GVT) protocol according to one embodiment of the invention

FIG. 9 shows the event processing rates of lookback-based protocols on the CQN shown in FIG. 8 with different configurations. FIG. 10 shows the speedup of LB-GVT on 4 CPUs, compared with the sequential execution of LB-GVT. The size of the CQN is determined by two parameters: the number of servers in each tandem and the number of tandems (or the number of switches). Another parameter is the number of tasks initially in each FCFS server. We can see that LB-EIT performs poorly; it achieves some speedup only with greater density of tasks. This result is the same as those obtained for simulations with lookahead-based protocols, because relatively low activity requires large number of null messages to advance the simulation clock. We see also that the number of switches has a great impact on the performance of LB-EIT. With increased numbers of switches, the number of FCFS servers connected to a switch also increases, thus a switch must sent more null messages to the FCFS servers, making LB-EIT less efficient. LB-EIT may outperform LB-GVT on systems with low connectivity.

The performance of LB-GVT with dropping control also drops when the task density is high. This is to be expected because as the queue and the departure time list become larger, the cost of maintaining the position for each task rises.

CONCLUSION

Lookback-based protocols introduce a new technique to exploit intra-logical process parallelism in simulation models. Surprisingly, the property of lookback, the ability to change the past, is closely related to the property of lookahead, the ability to predict the future. We have shown that lookback is more common in simulation models than lookahead. Furthermore, these two notions are complementary and can be exploited at the same time. It is of theoretical importance that lookback-based protocols allow conservative simulation to circumvent the critical path execution time limit.

However, the lookback-based protocols provide no general solution to PDES problems. Lookback does not exist in all simulation models, and even if it does exist, the lookback procedure may not be efficient. The utilization of lookback also complicates the simulation modeling, because out-of-timestamp execution has to be taken into consideration.

Despite of these two problems, we believe that our discovery of lookback points out a new direction for research in PDES. The feasibility and the performance of lookback-based protocols on a wide variety of simulation models have yet to be established by more extensive experiments. More efforts must be expanded to understand the semantics of the simulation time, which may lead to still more interesting approaches to PDES design.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of performing a simulation using a plurality of processing entities, each of the plurality of processing entities maintaining a respective one of a plurality of queues, each of the plurality of queues adapted to store a respective plurality of future events to be processed, each of the plurality of queues having an associated simulation time recording a time of the simulation as events are processed, the method comprising:
    establishing, for each of the plurality of future events in each queue, a respective virtual look-back time defining an earliest simulation time wherein processing any event having a timestamp later in time will not violate a causality constraint for a respective one of the plurality of future events for which the virtual look-back time is established; and
    selecting events to be processed from the plurality of queues based, at least in part, on respective virtual look-back times.

2. The method of claim 1, wherein the virtual look-back time is determined as the simulation time of the associated queue minus a look-back window established for each of the plurality of events.

3. The method of claim 2, wherein selecting events from the plurality of queues includes processing events in parallel, each of the plurality queues processing respective stored events in order from earliest virtual look-back time to latest virtual look-back time.

4. The method of claim 3, further comprising receiving, at one of the plurality of processing entities, a straggler event from another of the plurality of processing entities, the straggler event having a timestamp earlier than the simulation time of the queue of the one of the plurality of processing entities that received the straggler event.

5. The method of claim 4, further comprising, comparing the timestamp of the straggler event with the virtual look-back time of events processed by the one of the plurality of processing entities that have timestamps later in time than the timestamp of the straggler event.

6. The method of claim 5, wherein comparing includes identifying each processed event for which the timestamp of the straggler event is earlier in time than the virtual look-back time of the corresponding processed event.

7. The method of claim 6, further comprising rolling back each identified event for which the timestamp of the straggler event is earlier in time than the virtual look-back time of the corresponding processed event.

8. A computer-readable medium having computer-readable signals stored thereon that define instructions that, as a result of being executed by a computer, instruct the computer to perform a method of performing a simulation using a plurality of processing entities, each of the plurality of processing entities maintaining a respective one of a plurality of queues, each of the plurality of queues adapted to store a respective plurality of future events to be processed, each of the plurality of queues having an associated simulation time recording a time of the simulation as events are processed, the method comprising:
    establishing, for each of the plurality of future events in each queue, a respective virtual look-back time defining an earliest simulation time wherein processing any event having a timestamp later in time will not violate a causality constraint for a respective one of the plurality of future events for which the virtual look-back time is established; and
    selecting events to be processed from the plurality of queues based, at least in part, on respective virtual look-back times.

9. The computer-readable medium of claim 8, wherein the virtual look-back time is determined as the simulation time of the associated queue minus a look-back window established for each of the plurality of events.

10. The computer-readable medium of claim 9, wherein selecting events from the plurality of queues includes processing events in parallel, each of the plurality queues processing respective stored events in order from earliest virtual look-back time to latest virtual look-back time.

11. The computer-readable medium of claim 10, further comprising receiving, at one of the plurality of processing entities, a straggler event from another of the plurality of processing entities, the straggler event having a timestamp earlier than the simulation time of the queue of the one of the plurality of processing entities that received the straggler event.

12. The computer-readable medium of claim 11, further comprising, comparing the timestamp of the straggler event with the virtual look-back time of events processed by the one of the plurality of processing entities that have timestamps later in time than the timestamp of the straggler event.

13. The computer-readable medium of claim 12, wherein comparing includes identifying each processed event for which the timestamp of the straggler event is earlier in time than the virtual look-back time of the corresponding processed event.

14. The computer-readable medium of claim 13, further comprising rolling back each identified event for which the timestamp of the straggler event is earlier in time than the virtual look-back time of the corresponding processed event.

* * * * *